United States Patent [19]

Beasom

[11] Patent Number: 5,776,814
[45] Date of Patent: *Jul. 7, 1998

[54] PROCESS FOR DOPING TWO LEVELS OF A DOUBLE POLY BIPOLAR TRANSISTOR AFTER FORMATION OF SECOND POLY LAYER

[75] Inventor: James D. Beasom, Melbourne Village, Fla.

[73] Assignee: Harris Corporation, Melbourne, Fla.

[*] Notice: The term of this patent shall not extend beyond the expiration date of Pat. No. 5,614,422.

[21] Appl. No.: 775,360

[22] Filed: Jan. 3, 1997

Related U.S. Application Data

[63] Continuation of Ser. No. 405,660, Mar. 17, 1995, Pat. No. 5,614,422.

[51] Int. Cl.⁶ .................................................. H01L 21/331
[52] U.S. Cl. ........................ 438/364; 438/365; 438/564; 438/647; 438/648
[58] Field of Search .............................. 438/364, 365, 438/366, 368, 647, 648, 649, 682, 683, 558, 564

[56] References Cited

U.S. PATENT DOCUMENTS

| | | | |
|---|---|---|---|
| 4,752,589 | 6/1988 | Schaber | 437/34 |
| 4,902,640 | 2/1990 | Sachitano et al. | 437/162 |
| 4,960,726 | 10/1990 | Lechaton et al. | 437/162 |
| 4,978,629 | 12/1990 | Komori et al. | 437/162 |
| 5,354,699 | 10/1994 | Ikeda et al. | 437/34 |
| 5,403,758 | 4/1995 | Yoshihara | 437/162 |
| 5,614,422 | 3/1997 | Beasom | 437/31 |

*Primary Examiner*—Tuan H. Nguyen
*Attorney, Agent, or Firm*—Charles E. Wands

[57] ABSTRACT

A reduced mask set, implant complexity process for manufacturing a (high frequency application) complementary bipolar transistor structure uses the fast lateral diffusion characteristic of a layer of material, that is at least an order of magnitude higher for emitter dopants than in single crystal semiconductor material. Separate base and emitter poly layers are formed undoped. Then, the emitter poly of one device and the edges of the base poly of the other device are exposed through a dopant mask and simultaneously doped. The emitter dopant goes directly into the surface of the emitter poly where it lies over and is in contact with the base. The base contact dopant goes into the edges of the base poly, including the layer of material having the high diffusion coefficient, rapidly diffuses laterally throughout that layer, and then diffuses down into the collector material (e.g. island) surface, to form the extrinsic base. A second mask is patterned to expose the emitter of the second device and the edges of the base poly of the first device. Each device is then doped with the second type impurity through the second mask. The use of the high diffusion coefficient layer in the base contact enables the base dopant to spread laterally from the edge contact to the region where the base poly is in contact with the collector, with the same diffusion cycle that is used for the emitter.

29 Claims, 3 Drawing Sheets

PROCESS FOR DOPING TWO LEVELS OF A DOUBLE POLY BIPOLAR TRANSISTOR AFTER FORMATION OF SECOND POLY LAYER

This is a continuation of application Ser. No. 08/405,660, filed Mar. 17, 1995, now U.S. Pat. No. 5,614,422, issued Mar. 25, 1997.

FIELD OF THE INVENTION

The present invention relates in general to the manufacture of semiconductor circuits, and is particularly directed to a process for manufacturing a complementary bipolar transistor integrated circuit architecture, by using an initially undoped first polycrystalline semiconductor layer, that has a diffusion coefficient for impurities at least an order of magnitude greater than that of single crystal material, in order to facilitate a blanket lateral spreading of base-forming impurities for diffusion to an edge portion of an underlying intrinsic base region, into a surface region of which emitter impurities are diffused from a second polycrystalline semiconductor layer.

BACKGROUND OF THE INVENTION

Because the manufacture of complementary double poly bipolar transistors customarily requires the use of two separate emitter doping masks and two high dose emitter implants, in addition to two extrinsic base doping masks and two high dose extrinsic base implants, its cost and cycle time is undesirably high.

One proposal to reduce the complexity of such a mask set is described in the Ikeda U.S. Pat. No. 5,175,607, and involves only two implants to dope the base and emitter poly of both transistor polarity types. A sectional view of the architecture at the emitter poly formation stage of the Ikeda process (corresponding to FIG. 3L of the patent) is diagrammatically illustrated in FIG. 1. As shown therein, the Ikeda NPN device 1 has a conventional double poly transistor structure, in which the emitter poly layer 13 extends laterally above the base contact poly layer 11. This extension of the emitter poly layer allows the top of the emitter poly 13 to be wider than the width of the gap in the base contact poly 11, through which it contacts the base, and which defines the width of the emitter junction (desired to be small for best high frequency performance). The top width can be made as large as necessary to accommodate the emitter contact (where contact metal 19 meets emitter poly layer 13), including allowance for alignment tolerance, no matter how narrow the aperture in the base poly is made to improve high frequency performance.

The PNP device in FIG. 1 does not have the conventional double poly structure. In the PNP device, the emitter poly layer 15 is formed on the surface of the base, prior to formation of the base contact poly layer 17. The width of the emitter is set by the width of the emitter poly stripe. This stripe is formed with vertical side walls, to allow formation of side wall spacers 16, which separate the emitter poly layer 15 and the base contact poly layer 17. The base poly layer 17 is deposited and patterned after the spacers have been formed.

As a result of this structure, the emitter contact is necessarily narrower than the emitter junction (whose width is defined by the width of the contact between the emitter poly layer 15 and the island, because the emitter dopant diffuses from the emitter poly layer 15 into the base after the emitter poly has been patterned), if it is formed directly above the emitter, as shown in FIG. 1. A wider than desired emitter may be required to accommodate the smallest emitter contact which can be made in this case.

As diagrammatically illustrated in FIG. 1A, a wider contact, shown at 14, can be used if it is placed on a 'remote' portion of the emitter poly layer 15 not in contact with the base. A disadvantage of such a remotely located contact is the fact that emitter current must flow laterally through the emitter poly layer 15 from the emitter contact 14 to the emitter, which results in high emitter resistance, which reduces performance.

Further, in a conventional double poly transistor process, the base contact poly (base poly for short) and the extrinsic base, which is doped from the base poly by out-diffusion, are doped before the emitter is formed. This presence of extrinsic base doping during emitter poly formation limits the amount of high temperature treatment that can be performed in the emitter formation and doping process, since the extrinsic base diffuses vertically and laterally into the collector during the emitter processing. This limitation is particularly severe for shallow base, narrow emitter structures, such as are used for high frequency devices.

SUMMARY OF THE INVENTION

In accordance with the present invention, the shortcomings of the above prior art processes are effectively eliminated by a manufacturing methodology, which uses the fast lateral diffusion characteristic of a layer of material, that is at least an order of magnitude higher for emitter dopants than in single crystal semiconductor material. A fundamental feature of the invention is that both the base and emitter poly layers are formed undoped. Then, the emitter poly of one device and the edges of the base poly of the other device are exposed through a dopant mask and simultaneously doped, preferably by implantation.

The emitter dopant goes directly into the surface of the emitter poly where it lies over and is in contact with the base, as in a conventional process. The base contact dopant goes into the edges of the base poly, including the layer of material having the high diffusion coefficient, rapidly diffuses laterally throughout that layer, and then diffuses down into the collector material (e.g. island) surface, to form the extrinsic base. A second mask is patterned to expose the emitter of the second device and the edges of the base poly of the first device. Each device is then doped with the second type impurity through the second mask.

The use of the high diffusion coefficient layer in the base contact enables the base dopant to spread laterally from the edge contact to the region where the base poly is in contact with the collector, with the same diffusion cycle that is used for the emitter. Without it, during emitter diffusion, the dopant would not reach across the lateral distance, which might be ten times the thickness of the emitter poly. As a result, no extrinsic base would form and the transistor would not operate properly.

DETAILED DESCRIPTION

As pointed out briefly above, the present invention employs the fast lateral diffusion characteristic of a layer of material, that is at least an order of magnitude higher for emitter dopants than in single crystal semiconductor material, for the base contact layer, so that the base dopant may spread laterally from the edge contact to the region where the base poly is in contact with the collector, employing the same diffusion cycle for the emitter. The emitter dopant is implanted directly into the emitter poly, where it lies over and is in contact with the base. A second mask is then patterned to expose the emitter of the second device and the edges of the base poly of the first device. Each device is then doped with the second type impurity through the second mask.

Figure 2A:
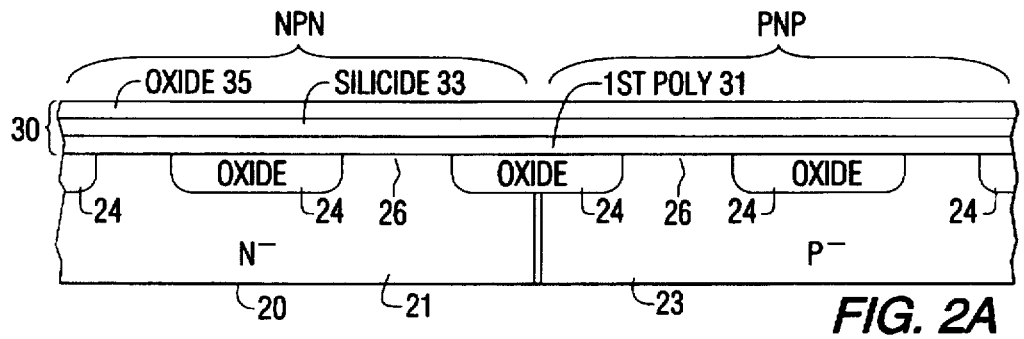
FIGS. 2A–2E are sectional views of a complementary bipolar transistor architecture, at respective steps of the manufacturing process of a first embodiment of the present invention, employing a three layer (oxide-silicide-poly) laminate structure.

The present invention will now be described with reference to FIGS. 2A–2E, which are sectional views of a non-limiting example of a complementary bipolar transistor architecture, such as that employed for ultra high frequency applications, at respective steps of the manufacturing process of a first embodiment of the present invention. As diagrammatically illustrated in FIG. 2A, isolated N and P type islands 21 and 23, in which respective NPN and PNP bipolar transistors are to be constructed, are formed in a semiconductor (e.g. silicon) substrate 20 in a conventional manner. In order to simplify the illustration, the isolation (junction or dielectric) between NPN and PNP islands 21 and 23 is not shown. Pockets of oxide 24 are provided at spaced apart surface portions of the substrate 20, leaving surface area portions 26 therebetween in which intrinsic base regions and shallow emitter regions are to be formed, as will be described.

At that point in the manufacturing process where the base poly is to be deposited, a multilayer laminate or stack structure 30 is formed on the top surface 25 of substrate 20. This multilayer laminate structure 30 is composed of a first layer 31 of undoped polycrystalline silicon (or simply poly), which is formed directly on the top surface 25 of the substrate 20. The poly layer 31 may be deposited by low pressure chemical vapor deposition (LPCVD) to a thickness on the order of, for example, 2000 Å.

Atop the first layer 31 of undoped poly is a second layer of high diffusion coefficient material 33, such as tungsten silicide. The suicide layer 33 may be deposited by sputtering to a thickness on the order of, for example, 2000 Å and may be deposited 'silicon-rich' to reduce stress. By high diffusion coefficient is meant a diffusion coefficient that is at least an order of magnitude higher than it is in single crystal silicon. As non-limiting examples, boron (B), arsenic (As) and phosphorus (P) have diffusion coefficients in tungsten silicide about 5 to 7 orders of magnitude higher than they do in single crystal silicon.

Finally, a layer of (silicon) oxide 35 is formed upon the second layer 33 of tungsten silicide. The oxide layer 35 may be formed by plasma assisted chemical vapor deposition, and may include a precursor thin layer of oxide grown thermally on the silicide, to a thickness on the order of, for example, 2000 Å.

Figure 2B:
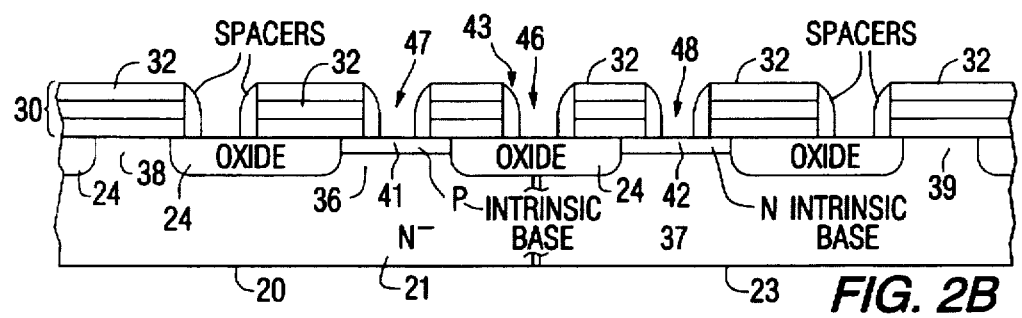

As shown in FIG. 2B, the laminate structure 30 of FIG. 2A is then selectively patterned, for example, by an anisotropic etch, down to the surface of the substrate 20, thereby leaving rings 32 of the stack around active base areas 36, 37 and over collector contact surface regions 38, 39, where first poly layer 31 normally remains. In addition, a gap 46 is formed in the laminate structure 30 overlying oxide 24 between the NPN and PNP devices. This gap prevents dopants introduced into one base contact from diffusing through the continuous sheet of silicide 33 to the opposite type doped base contact of the complementary transistor. Also shown in FIG. 2B are a P-type intrinsic base region 41, and an N-type intrinsic base region 42, as well as adjacent sidewall spacers 43, which are formed in a conventional manner through apertures of the etched laminate structure.

Figure 2C:
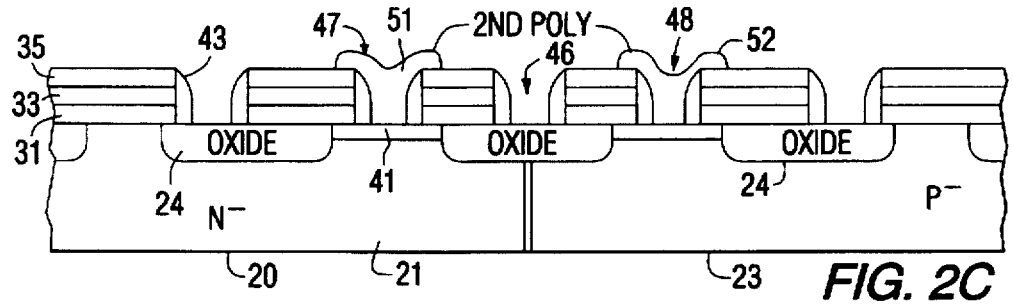

Next, a second layer of undoped polysilicon is non-selectively deposited (for example, by low pressure chemical vapor deposition) over the entire wafer surface, so as to fill gap 46 and apertures 47 and 48. This layer of undoped polysilicon is then masked and etched, using, for example, standard photo-resist patterning and plasma etch, thereby leaving undoped poly plugs 51 and 52 in apertures 47 and 48, respectively, as shown in FIG. 2C. An optional oxide layer (not shown) can be formed on the second undoped poly layer after it is patterned into the plugs, if desired.

This structure may then be heated to a prescribed elevated temperature, for example, a temperature on the order of at least 900° C., which serves to improve the interface between the base and the emitter poly plug before doping the emitter and extrinsic base.

Figure 2D:
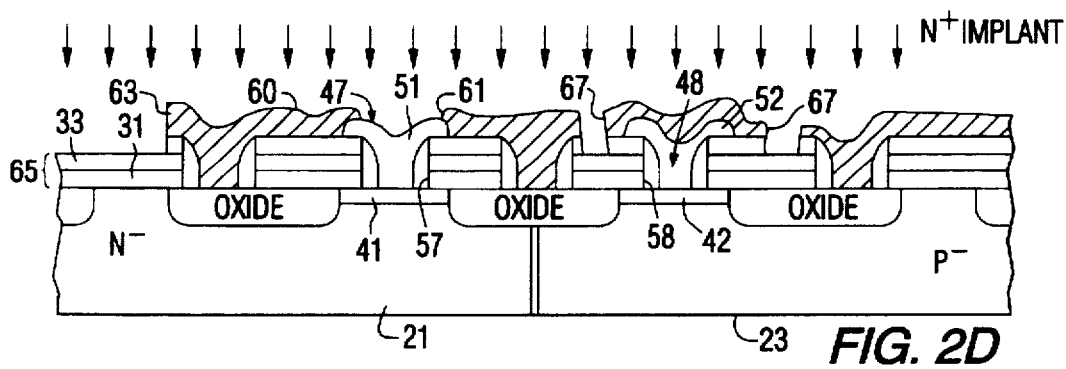
Figure 2E:
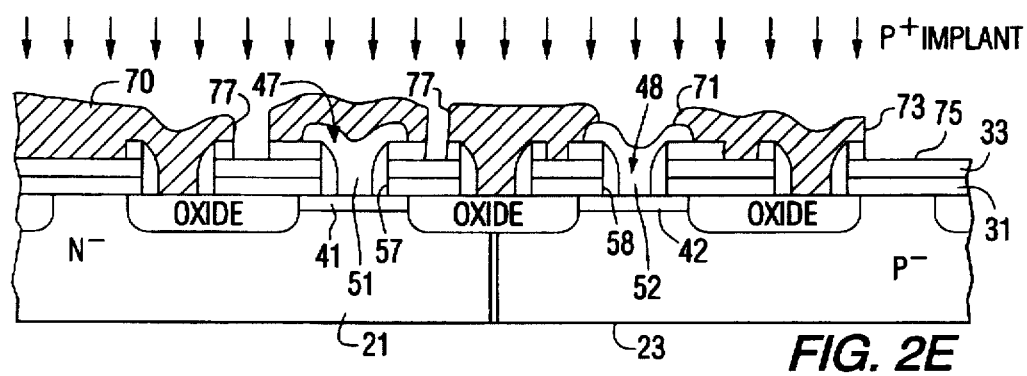

As illustrated in FIG. 2D, a first photoresist layer 60 is then selectively formed (e.g. deposited, exposed and developed) on the structure of FIG. 2C, thereby providing a first opening 61 over emitter poly plug 51, a second opening 63 over a first collector contact oxide-silicide-poly stack region 65 associated with the NPN transistor structure, and a third opening 67 in the vicinity of or near the edge 58 of aperture 48 through which the emitter poly plug 52 of the PNP transistor has been formed.

Using this first photoresist mask 60, those portions of the oxide layer 35 exposed by the openings 63 and 67 is etched away, thereby leaving underlying tungsten silicide layer 33 exposed through the mask apertures. An N type implant (e.g. As or P) is then performed with the resist mask 60 still in place, to thereby dope each of the exposed emitter poly plug 51, the collector contact silicide region 65, and base silicide material exposed by the third opening 67.

After this N+ implant, the resist mask 60 is removed and a new layer of resist material 70 is deposited, exposed and developed, to leave a first opening 71 over emitter poly plug 52, a second opening 73 over a second collector contact oxide-silicide-poly stack region 75 associated with the PNP transistor structure, and a third opening 77 in the vicinity of the edge 57 of aperture 47 through which the emitter poly plug 51 of the NPN transistor has been formed. Thus, the third opening 77 is closer to the edge 57 of aperture 47 and farther away from edge 58 of aperture 48.

Using the second photoresist mask 70, those portions of the oxide layer 35 exposed by the openings 73 and 77 are etched away, thereby leaving underlying tungsten silicide layer 33 exposed through the apertures in the second photoresist mask layer 70. A P type implant (e.g. B) is then performed with the second resist mask 70 still in place, to thereby dope each of the exposed emitter poly plug 52, the collector contact silicide region 75, and base silicide material exposed by the third opening 77.

After the second implant, a diffusion cycle (for example, by performing a rapid thermal anneal) may be carried out, so as to drive the dopants through the emitter poly plugs 51 and 52, and into the surface of each of P-type intrinsic base regions 41 and N-type intrinsic base region 42. This same diffusion step will also drive the N+ base dopant that has been introduced through aperture 67 and the P+ base dopant that has been introduced through aperture 77 laterally throughout silicide layer 33.

Since the diffusion coefficient for these dopants in silicide layer 33 is at least an order of magnitude higher than it is in the single crystal silicon of the intrinsic base-containing substrate 20, as noted above, the dopants diffuse laterally through the silicide almost instantly, and then down into the underlying intrinsic base regions 41 and 42 of the substrate, so as to form extrinsic bases for the respective NPN and PNP transistors.

When one of the dopants has a lower diffusion coefficient than the other, for example in the case of using As, which has a relatively slower diffusion coefficient than B, as a modification of the above-described sequence of steps, it may be desirable to perform a diffusion step after the first (N+) implant and prior to the second (P+) implant, since the slower (lower diffusion coefficient) diffusing dopant (e.g. As) will require more diffusion time to reach a given junction depth than the second implant (e.g. B). The device is completed by forming one or more levels of metal interconnect and passivation using conventional processing.

It may be appreciated that a novel feature of the foregoing process arises from the fact that the base poly layer 31 is undoped, when the emitter plug poly layer is deposited. This allows relatively large Dt thermal cycles to be used after the emitter poly is deposited. Such cycles can be used to break up interfacial oxide layers, so as to reduce emitter resistance and make device characteristics more uniform.

Figure 3A:
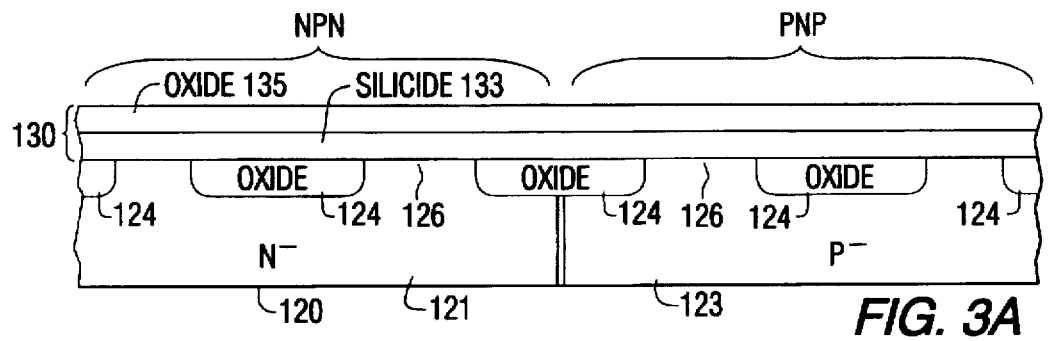
FIGS. 3A–3E are sectional views of a complementary bipolar transistor architecture, at respective steps of the manufacturing process of a second embodiment of the present invention, employing a two layer (oxide-silicide) laminate structure.

Pursuant to a second embodiment of the invention, diagrammatically illustrated in FIGS. 3A–3E, the poly layer of the laminate structure shown in FIG. 2A is eliminated, and the silicide layer is formed directly on the surface of the substrate. More particularly, as shown in FIG. 3A, a multi-layer stack structure 130, formed on the top surface 125 of a substrate 120, is composed of a first layer of high diffusion coefficient material 133 (e.g. tungsten silicide) and a second layer of (silicon) oxide 135.

As in the first embodiment, the tungsten silicide layer 133 may be deposited directly on the underlying substrate 120 by sputtering to a thickness on the order of, for example, 2000 Å and may be deposited 'silicon-rich' to reduce stress; the oxide layer 135 may be formed by plasma assisted chemical vapor deposition, and may include a precursor thin layer of oxide grown thermally on the silicide, to a thickness on the order of, for example, 2000 Å.

The laminate structure 130 of FIG. 3A is selectively patterned, down to the surface of the substrate 120, to again form rings 132 of a dual laminate around active base areas 136, 137 and over collector contact surface regions 138, 139, and a gap 129 between the PNP and NPN devices. Also shown in FIG. 3B are a P-type intrinsic base region 141, and an N-type intrinsic base region 142, as well as adjacent sidewall spacers 143.

Figure 3B:
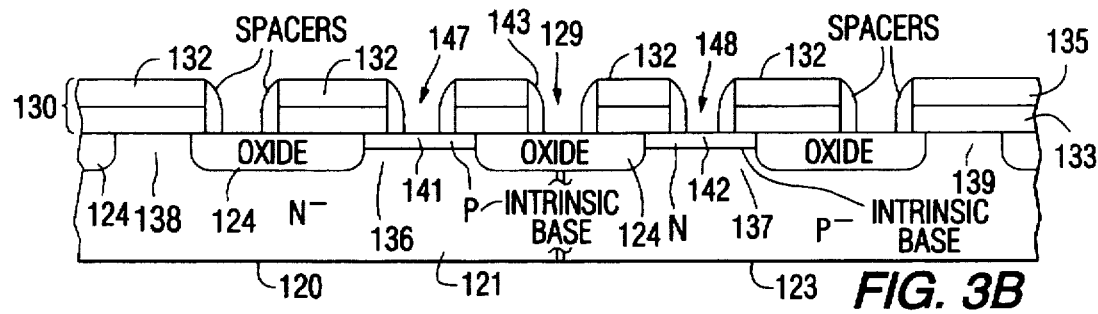
Figure 3C:
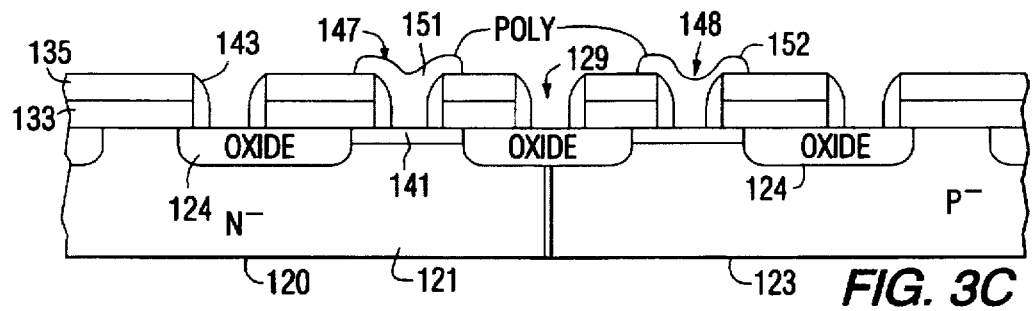

As shown in FIG. 3C, a layer of undoped polysilicon is non-selectively deposited over the entire wafer surface, so as to fill the gap 129, and apertures 147 and 148 of the patterned laminate structure of FIG. 3B, thereby forming an undoped poly plug in gap 129 and undoped poly plugs 151 and 152 in and apertures 147 and 148, respectively. As in the first embodiment, this layer of undoped polysilicon is then masked and etched, using, for example, standard photoresist patterning and plasma etch, thereby leaving undoped poly plugs in the patterned laminate structure of FIG. 3B. As in the first embodiment, an optional oxide layer (not shown) can be formed on the undoped poly layer after it is patterned into plugs.

Figure 3D:
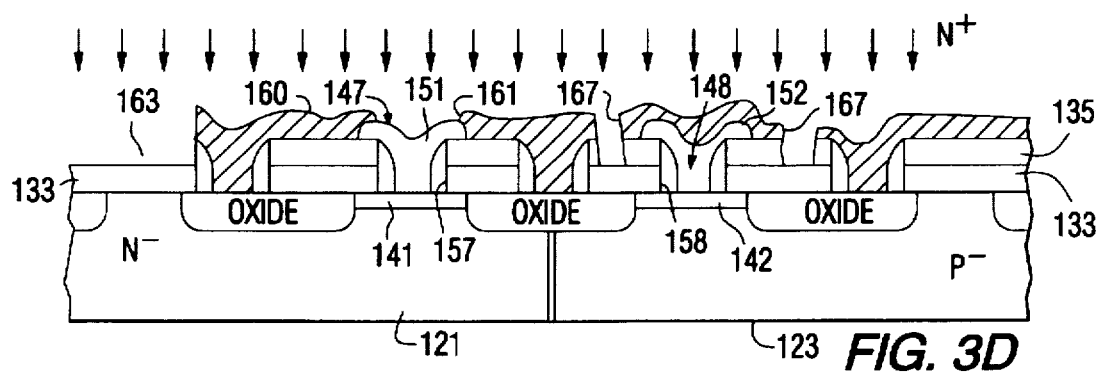

Next, as shown in FIG. 3D, a first photoresist layer 160 is non-selectively deposited on the structure of FIG. 3C, and then masked and developed, to provide a first opening 161 over emitter poly plug 151, a second opening 163 over a first collector contact oxide-silicide stack region 165 associated with the NPN transistor structure, and a third opening 167 near the edge 158 of aperture 148 through which the emitter poly plug 152 of the PNP transistor has been formed.

Through the openings in photoresist mask layer 160, those portions of the oxide layer 135 exposed by the openings 163 and 167 is etched away, thereby leaving underlying tungsten silicide layer 133 exposed through the mask apertures. With the resist mask 160 still in place, an N type implant (e.g. As or P) is then carried out, to thereby dope each of the exposed emitter poly plug 151, the collector contact silicide region 165, and base silicide material exposed by the third opening 167.

Figure 3E:
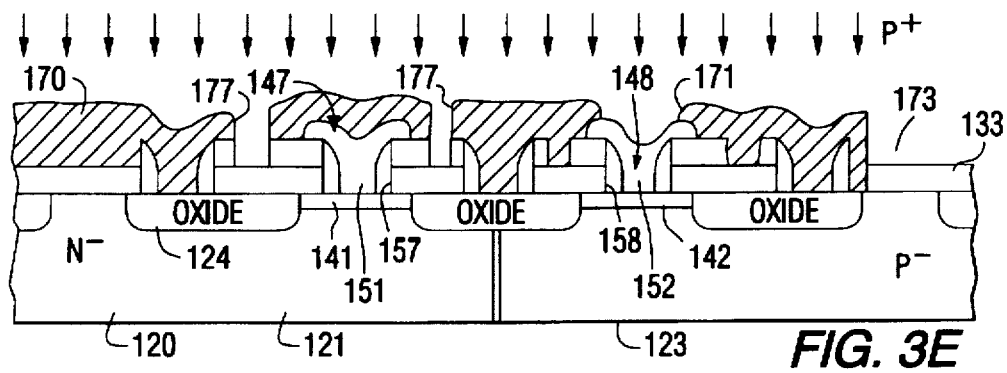

After this first (N+) implant step, the first resist mask layer 160 is removed and a new layer of resist material 170 is non-selectively deposited, masked and developed, as shown in FIG. 3E, so as to provide a first opening 171 over emitter poly plug 152, a second opening 173 over a second collector contact oxide-silicide stack region associated with the PNP transistor structure, and a third opening 177 in the vicinity of the edge 157 of aperture 147 through which the emitter poly plug 151 of the NPN transistor has been formed.

Then, using the second photoresist mask layer 170, those portions of oxide layer 135 exposed by the openings 173 and 177 are etched away, leaving underlying tungsten silicide layer 133 exposed through the apertures in the second photoresist mask layer 170. With the second resist mask 170 still in place, a P type implant is performed, so as to dope each of the exposed emitter poly plug 152, the collector contact silicide region 175, and base silicide material exposed by the third opening 177.

After the second (P+) implant step, a (rapid anneal) diffusion cycle may be carried out, so as to drive the dopants through the emitter poly plugs 151 and 152, and into the surface of each of P-type intrinsic base region 141 and N-type intrinsic base region 142. This same diffusion step will also drive the N+ base dopant that has been introduced through aperture 167 and the P+ base dopant that has been introduced through aperture 177 laterally throughout silicide layer 133, and then down into the underlying intrinsic base regions 141 and 142, so as to form extrinsic bases for the respective NPN and PNP transistors.

The base resistance of the structure resulting from the second embodiment of FIGS. 3A–3E can be expected to be somewhat lower than the first embodiment of FIGS. 2A–2E, since silicide has a lower resistivity than poly. Thus, in the second embodiment, removing the first poly layer from the laminate structure of the first embodiment effectively removes a region of higher resistance from the path between extrinsic base material and the metal contact to the base stack.

As a modification of the second embodiment, in order to provide improved process control of the collector thickness, it may be desirable to use a silicide (or other alternative material having a high diffusion coefficient), which is capable of being etched with an etchant having a high selectivity to silicon, so that any over etch of such a silicide layer will cause only minimal etch of the underlying silicon in the area where the emitter will be formed.

Figure 1:
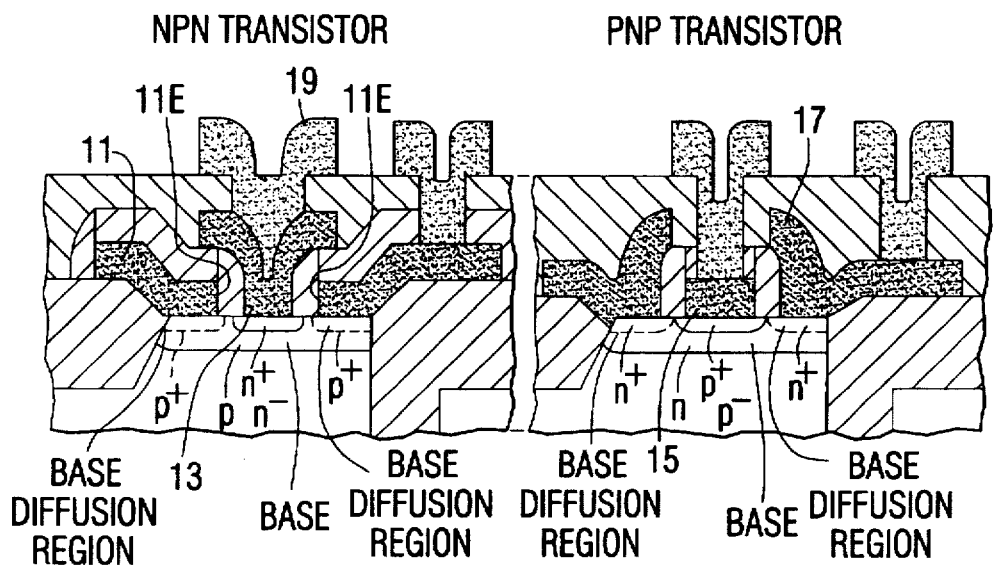
FIG. 1 diagrammatically illustrates a sectional view of a semiconductor architecture corresponding to FIG. 3L of the Ikeda U.S. Pat. No. 5,175,607.
Figure 1A:
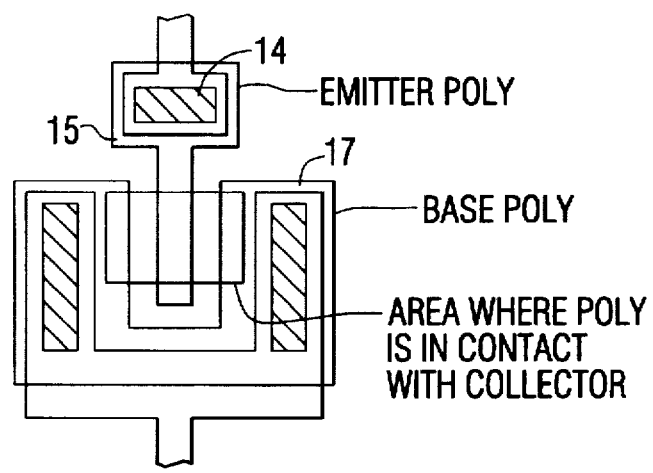
FIG. 1A diagrammatically illustrates a plan view of FIG. 1, wherein a wider emitter contact is placed on a remote portion of the emitter poly layer not in contact with the base.
Figure 4:
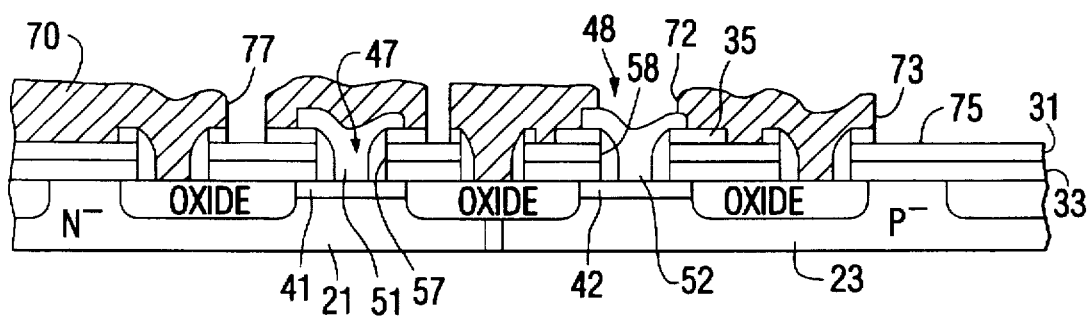
FIG. 4 diagrammatically illustrates a sectional view of a device in accordance with a third embodiment of the present invention, in which the order of the poly and silicide layers of the laminate structure of the first embodiment of FIGS. 2A–2E is reversed.

Pursuant to a third embodiment, the order of the poly and silicide layers of the laminate structure of the first embodiment of FIGS. 2A–2E may be reversed, as shown in the resulting structure of FIG. 4, where the silicide layer 33 is formed directly on the substrate 20, and the poly layer 31 is disposed atop the silicide layer 33. This structural configuration preserves the selectivity advantage described above. Here, the first poly layer 31 provides additional thickness in which implant can be absorbed. (The implant is spread over a thickness of typically thousands of angstroms and only the part of the implant, which stops in the layers where it has high diffusion coefficient, contributes to doping).

To accomplish the same result in the second embodiment, the thickness of the silicide layer 133 could be increased. However, when a silicide layer is made too thick, the resulting stress can cause cracking or other problems.

In order to adjust the depth into the substrate of the extrinsic base relative to the depth into the substrate of the emitter, several parameters can be varied. First, the layer of poly 31 in the laminate 30 can be made extremely thin (or deleted altogether as in the second embodiment), so that it does not present as much of a slow diffusion path for the extrinsic base doping, when the extrinsic base is to be relatively deeper. Alternatively, the emitter poly plug layer can be made thicker or amorphous, rather than polycrystalline, in order to make the emitter shallower relative to the extrinsic base.

A number of additional variations to the process flows described above can be used, while retaining the advantages of the invention. For example, the intrinsic base can be formed after the spacers are formed, rather than before they are formed. Also, the order of N+ and P+ masking and implant steps can be interchanged. Further, the oxide layer formed atop the silicide in the base contact stack may be left unetched, before one or both of the N+ and P+ implants are carried out, and the implants then conducted through the oxide. In addition, insulator material other than oxide may be employed in place of some or all of the oxide layer in the base contact stack. Other variations which retain the high diffusion coefficient layer in the base contact and dope the base contact after the emitter poly is formed are also possible.

For example, in the above embodiments, rather than form the intrinsic base region (e.g. 41 and 42) prior to depositing the emitter poly plugs (e.g. 51 and 52), the process may be varied to diffuse the intrinsic base regions through the emitter poly plugs. This provides more freedom to use thermal cycles after emitter polysilicon deposition, for example, to break up interfacial oxide, since the intrinsic base will not be diffused into the collector by the emitter poly Dt in such a case. The process described above can also be applied to the manufacture of only one type of transistor (e.g. NPN). Such a device will benefit from the freedom to use large Dt to improve the emitter interface before the base poly is doped.

As will be appreciated from the foregoing description, the desirability of eliminating the use of a complex mask and implant sequence for the manufacture of complementary double poly bipolar transistors, without limiting the performance resulting from increased emitter resistance due to the inability to contact the emitter poly layer directly over a very narrow emitter opening, is successfully addressed by the present invention, which uses the fast lateral diffusion characteristic of a layer of material, that is at least an order of magnitude higher for emitter dopants than in single crystal semiconductor material.

As explained above, a basic attribute of the invention is the fact that both the base and emitter poly layers are formed undoped, and in particular, the base poly layer is undoped, when the emitter plug poly layer is deposited. This allows relatively large Dt thermal cycles to be used after the emitter poly is deposited. The emitter poly of one device and the edges of the base poly of the other device are exposed through a dopant mask and simultaneously doped.

In the embodiments described above, the emitter and/or base polysilicon material may be lightly doped at, or just after the time of deposition, with the doping being augmented by a later doping step. The preferred process is to use nominally undoped polysilicon at deposition. It should be understood, however, that light doping is also satisfactory and may be obtained as a result of residual dopant contamination from the polysilicon deposition system.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing a semiconductor device comprising the steps of:
    (a) selectively forming a first layer on a surface of a second layer of semiconductor material, so as to leave a surface area region of said second layer exposed by an aperture through said first layer, said first layer containing material having a diffusion coefficient for impurities at least an order of magnitude greater than that of said second layer;
    (b) forming a third layer, of semiconductor material, in said aperture and upon said surface area region of said second layer; and
    (c) after the formation of said third layer upon said surface area region of said second layer in step (b), doping said first layer with conductivity type determining impurities.

2. A method according to claim 1, wherein step (c) further includes doping said third layer with conductivity type impurities.

3. A method according to claim 2, wherein step (c) includes introducing conductivity type determining impurities into only a prescribed portion of said first layer which is spaced apart from said aperture through said first layer, and annealing the structures of said first and third layers into which conductivity impurities have been introduced, so as to cause impurities doped into said third layer to diffuse vertically therethrough to said second layer, and to cause impurities that have been introduced into said prescribed portion of said first layer to diffuse laterally throughout said first layer and diffuse vertically through said first layer to said second layer.

4. A method according to claim 3, wherein said first layer comprises a first polycrystalline semiconductor layer portion that is formed directly upon said surface of said second layer, and a second layer portion that is formed on said first polycrystalline semiconductor layer portion and has said diffusion coefficient, and wherein step (c) comprises introducing conductivity type determining impurities into only a prescribed portion of said second layer portion which is spaced apart from said aperture through said first layer, and annealing the resultant structure, so as to cause conductivity type determining impurities that have been introduced into said prescribed portion of said second layer portion to diffuse laterally throughout said prescribed portion of said second layer portion and vertically through said second layer portion and into and through said first polycrystalline semiconductor layer portion to said second layer.

5. A method according to claim 3, wherein said first layer comprises a first layer portion that is formed directly upon said surface of said second layer and has said diffusion coefficient, and wherein step (c) comprises introducing conductivity type determining impurities into only a prescribed portion of said first layer portion which is spaced apart from said aperture through said first layer, and annealing the resultant structure, so as to cause said conductivity type determining impurities that have been introduced into said prescribed portion of said first layer portion to diffuse laterally throughout said first layer portion and vertically through said first layer portion to said second layer.

6. A method according to claim 2, wherein said surface area region of said second layer exposed by said aperture through said first layer has a conductivity type opposite to that of conductivity type determining impurities doped into said third layer in step (c).

7. A method according to claim 1, wherein said surface area region of said second layer exposed by an aperture through said first layer has a conductivity type corresponding to that of said conductivity type determining impurities doped into said first layer in step (c).

8. A method according to claim 1, wherein step (c) includes the step of causing simultaneous diffusion of said conductivity type determining impurities through said third layer in said aperture, and diffusion of conductivity type determining impurities through said first layer.

9. A method according to claim 1, wherein said surface area region of said second layer has a first conductivity type, and wherein step (c) further comprises introducing impurities of a second conductivity type into said third layer.

10. A method according to claim 1, further including the step of heating the structure resulting from step (b) to a prescribed elevated temperature prior to performing step (c).

11. A method according to claim 10, wherein said prescribed elevated temperature is at least 900° C.

12. A method of manufacturing a semiconductor device comprising the steps of:
   forming a first layer on a surface of a second layer of semiconductor material, said first layer containing material having a diffusion coefficient for impurities at least an order of magnitude greater than that of said second layer;
   introducing conductivity type determining impurities into only a prescribed portion of said first layer; and
   causing impurities that have been introduced into only said prescribed portion of said first layer to diffuse laterally throughout said first layer and diffuse vertically through said first layer to said second layer.

13. A method according to claim 12, wherein said first layer is selectively formed on said surface of said second layer of semiconductor material, so as to leave a surface area region of said second layer exposed by an aperture through said first layer, said prescribed portion of said first layer is spaced apart from said aperture, and impurities that have been introduced into only said prescribed portion of said first layer are caused to diffuse laterally throughout said first layer and diffuse vertically through said first layer to a surface portion of said second layer, which is contiguous with said surface area region of said second layer.

14. A method according to claim 13, further including the step of forming a third layer of semiconductor material in said aperture and upon said surface area region of said second layer, introducing impurities of said opposite conductivity type into said third layer, and causing said opposite conductivity type impurities in said third layer to be doped therefrom into said surface area region of said second layer.

15. A method according to claim 14, wherein said opposite conductivity type impurities in said third layer are caused to be doped therefrom into said surface area region of said second layer, simultaneously with causing impurities that have been introduced into only said prescribed portion of said first layer to diffuse laterally throughout said first layer and diffuse vertically through said first layer to said second layer.

16. A method according to claim 12, wherein a surface portion of said second layer, which is contiguous with said surface area region of said second layer, comprises an extrinsic base region of a bipolar transistor and has a conductivity type corresponding to that of impurities introduced into said prescribed portion of said first layer, and which diffuse therefrom laterally throughout said first layer and vertically through said first layer to said extrinsic base region in said surface portion of said second layer.

17. A method of manufacturing a semiconductor device comprising the steps of:
   (a) selectively forming a first layer on a surface of a second layer containing semiconductor material and insulator material, so that said first layer is spaced apart from said semiconductor material by said insulator material, except for an overlapped portion of a surface area region of said semiconductor material adjacent to said insulator material, said surface area region of said semiconductor material including an exposed portion that is exposed by an aperture through said first layer,
   (b) forming a third layer of semiconductor material in said aperture and upon said exposed portion of said surface area region of said second layer; and
   (c) after the formation of said third layer upon said exposed portion of said surface area region of said second layer in step (b), selectively doping conductivity type determining impurities into said first layer, by introducing impurities into only a prescribed portion of said first layer overlying said insulator material.

18. A method according to claim 17, wherein said first layer contains material having a diffusion coefficient for said impurities that is at least an order of magnitude greater than that of said second layer.

19. A method according to claim 18, wherein step (c) includes causing said impurities introduced into said prescribed portion of said first layer to diffuse laterally throughout said first layer and vertically through said first layer into said semiconductor material of said second layer.

20. A method according to claim 19, wherein said first layer comprises a first polycrystalline semiconductor layer portion that is formed directly upon said surface of said second layer, and a second layer portion that is formed on said first polycrystalline semiconductor layer portion and has said diffusion coefficient, and wherein step (c) comprises introducing conductivity type determining impurities into only a prescribed portion of said second layer portion which is spaced apart from said aperture through said first layer, and annealing the resultant structure, so as to cause conductivity type determining impurities that have been introduced into said prescribed portion of said second layer portion to diffuse laterally throughout said prescribed portion of said second layer portion and vertically through said second layer portion and into and through said first polycrystalline semiconductor layer portion to said semiconductor material of said second layer.

21. A method according to claim 19, wherein said first layer comprises a first layer portion that is formed directly upon said surface of said second layer and has said diffusion coefficient, and wherein step (c) comprises introducing conductivity type determining impurities into only a prescribed portion of said first layer portion which is spaced apart from said aperture through said first layer, and annealing the resultant structure, so as to cause said conductivity type determining impurities that have been introduced into said prescribed portion of said first layer portion to diffuse laterally throughout said first layer portion and vertically through said first layer portion to said semiconductor material of said second layer.

22. A method according to claim 17, further including the step of heating the structure resulting from step (b) to a prescribed elevated temperature prior to performing step (c).

23. A method according to claim 22, wherein said prescribed elevated temperature is at least 900° C.

24. A method of manufacturing a semiconductor device comprising the steps of:
  (a) forming a first layer on a surface of a second layer containing semiconductor material and insulator material, so that said first layer is spaced apart from said semiconductor material by said insulator material, except for an overlapped portion of a surface area region of said semiconductor material adjacent to said insulator material;
  (b) selectively doping conductivity type determining impurities into said first layer, by introducing impurities into only a prescribed portion of said first layer overlying said insulator material; and
  (c) causing impurities that have been introduced into only said prescribed portion of said first layer to diffuse laterally throughout said first layer and diffuse vertically through said first layer to semiconductor material of said second layer.

25. A method according to claim 24, wherein said first layer contains material having a diffusion coefficient for impurities that is at least an order of magnitude greater than that of said second layer.

26. A method according to claim 24, wherein step (a) comprises selectively forming said first layer formed on said surface of said second layer of semiconductor material, so as to leave a surface area region of said semiconductor material exposed by an aperture through said first layer, and wherein said prescribed portion of said first layer is spaced apart from said aperture, and wherein step (c) comprises causing impurities that have been introduced into only said prescribed portion of said first layer to diffuse laterally throughout said first layer and diffuse vertically through said first layer to a surface portion of said second layer, which is contiguous with said surface area region of said second layer.

27. A method according to claim 24, further including the step (d) of forming a third layer of semiconductor material in said aperture and upon said surface area region of said second layer, introducing impurities of said opposite conductivity type into said third layer, and causing said opposite conductivity type impurities in said third layer to be doped therefrom into said surface area region of said second layer.

28. A method according to claim 27, wherein step (c) further comprises causing said opposite conductivity type impurities in said third layer to be doped therefrom into said surface area region of said second layer, simultaneously with causing impurities that have been introduced into only said prescribed portion of said first layer to diffuse laterally throughout said first layer and diffuse vertically through said first layer to said second layer.

29. A method according to claim 24, wherein a surface portion of said second layer, which is contiguous with said surface area region of said second layer, comprises an extrinsic base region of a bipolar transistor and has a conductivity type corresponding to that of impurities introduced into said prescribed portion of said first layer, and which diffuse therefrom in step (c) laterally throughout said first layer and vertically through said first layer to said extrinsic base region.

\* \* \* \* \*